United States Patent

Kelly, Jr.

[15] 3,701,077

[45] Oct. 24, 1972

[54] ELECTRONIC COMPONENTS

[72] Inventor: Cornelius J. Kelly, Jr., Holliston, Mass.

[73] Assignee: K-Tech, Inc., Framingham, Mass.

[22] Filed: Dec. 29, 1969

[21] Appl. No.: 888,326

[52] U.S. Cl......339/17 CF, 174/DIG. 3, 317/101 CP, 324/158 F, 339/75 MP, 339/176 MP

[51] Int. Cl................................................H05k 1/02

[58] Field of Search......324/158 F; 339/17 CF, 17 N, 339/17 L, 17 LM, 17 M, 75, 66, 176 MP; 174/DIG. 3; 317/101 CP, 101 CC, 101 C

[56] References Cited

UNITED STATES PATENTS

| | | | |
|---|---|---|---|
| 3,573,617 | 4/1971 | Randolph et al. | ...339/17 CF X |
| 3,506,949 | 4/1970 | Vaneleck et al. | ..........339/174 |
| 3,504,330 | 3/1970 | Holzhaeuser | .........339/75 MP |
| 3,345,541 | 10/1967 | Cobaugh et al. | ....339/17 CF X |
| 3,475,657 | 10/1969 | Knowles | ...............339/17 C X |
| 3,441,853 | 4/1969 | Bodine | ...............339/17 CF X |
| 3,448,345 | 6/1969 | Koehler, Jr. et al. | .......317/101 CC |

*Primary Examiner*—Marvin A. Champion
*Assistant Examiner*—Terrell P. Lewis
*Attorney*—R. V. Patrick

[57] ABSTRACT

A socket for electronic components particularly useful for "dual-in-line" packages, comprising a housing of electrical insulating material having an end wall defining a closed end, an opposite open end, and a plurality of electrical contact members extending generally between these ends, each having a spring portion providing a contact surface, each contact surface engaging the outer surface of one of the leads of the electronic component at a point along the length of the lead, when the component is inserted into the socket through its open end in such a way that the circuitry of the component is adjacent the closed end of the socket, and its leads extend therefrom toward the open end of the socket.

6 Claims, 3 Drawing Figures

ELECTRONIC COMPONENTS

This invention relates to sockets for electronic components, particularly components containing semiconductor-type circuitry.

Semiconductor-type circuits, such as integrated circuits, "MSI" and "LSI" circuits, and hybrid circuits are commonly packaged in an insulated block with a plurality of thin parallel leads or sets thereof emerging from the block, and connected to the appropriate component of the circuitry within. To test these packages, the leads must be electrically connected to test circuitry. For making this connection, sockets have been proposed which receive these packages, leads first, the leads engaging appropriate contact surfaces within the socket, which are in turn connected to the test circuitry.

However, as manufactured, these circuitry packages often have non-parallel leads; inserting such packages into sockets designed to receive parallel leads not only is a slow process but can cause breaking of the package leads, or eventual failure of the sockets, due to excessive contact, during insertion of the package, between the ends of the leads and the socket. Furthermore, the ends of the leads, which may be somewhat sharp or rough, tend to scrape the gold surface coating from the socket contacts, again promoting socket failure. The need for reliability of these sockets is further intensified in life-cycle testing, where packages are tested continuously under elevated temperatures for periods up to 1000 hours. Failure of a socket midway through such a life-cycle test necessitates repeating the entire life-cycle test with the package in a different socket.

It is therefore an object of the present invention to provide an improved test socket for a circuitry package, which will surrender the package intact after testing, and may be used to test successively a number of such packages.

Another object is to provide a reliable, durable and versatile socket for receiving circuitry packages, particularly packages having non-parallel lead wires.

A further object is to provide such a socket in a form that is of simple, light-weight construction, is easy to manufacture, and can be readily inserted into conventional circuitry testing apparatus.

Another object is to provide an improved socket-package assembly for semiconductor-type circuitry, such as integrated circuits, "MIS" and "LIS" type circuits, hybrid circuits, and the like.

In one aspect, the invention features, in combination, an electronic component having a body enclosing circuitry and a plurality of leads from this circuitry projecting from the body, all the leads terminating on one side of a plane through the body and each lead having an outer surface facing away from other leads; and, a socket comprising a housing of electrical insulating material having an end wall defining a closed end and an opposite open end, and a plurality of electrical contact members extending from the closed end toward the open end, each contact member having a spring portion providing a contact surface engaging the outer surface of one of the leads between the circuitry and the terminating end of the lead, the component being oriented in the socket with its body adjacent the closed end of the socket and the leads extending toward the open end of the socket.

In another aspect, the invention features a socket comprising a housing having an end wall defining a closed end, opposed parallel side walls, substantially perpendicular to the end wall, extending to the end wall, and spaced apart to define an open end opposite to the end wall, a plurality of spaced-apart parallel ribs projecting inwardly from each of the side walls and extending along each side wall between the end wall and the open end to define with the adjacent side wall a plurality of spaced-apart parallel channels, and a plurality of electrical contact members, each having a spring portion located entirely in one of these channels and providing a contact surface facing away from the side wall defining the particular channel and located between the side wall and a plane parallel to the side wall through the innermost edge of one of the channel-defining ribs.

In a preferred embodiment, the electronic component is of the type known commercially as a "dual-in-line package" or "DIP", having two sets of leads, spaced apart from one another, each set having its leads arranged substantially in parallel, with the sets extending along opposite sides of the package and making an angle of about 0° to 30° with one another; the socket for this "dual-in-line" package comprises two sets of contact members defining two sets of contact surfaces, each set having its contact surfaces arranged in a single plane, and the sets of contact members spaced apart from one another by a distance less than the distance between the sets of leads; the socket housing has substantially parallel side walls, substantially perpendicular to the bottom wall, extending therefrom, and spaced apart to define the open end of the housing, and one set of contact members is arranged adjacent each side wall; the socket includes ribs defining a plurality of spaced-apart channels extending along each of these side walls from the bottom wall to the open end of the socket, one of the contact members being located entirely in each channel, so that its contact surface lies between the side wall and a plane defined by the innermost edge of one of the ribs defining the channels; the "dual-in-line" package has leads projecting outwardly of the circuitry-enclosing body, so that each lead, when engaged with a socket contact surface, terminates within a channel of the socket; and each contact member includes a rigid shank at one end extending through the end wall of the housing for making external electrical connection to other circuitry, an end portion at its other end constructed to diverge away from the engaged lead toward a side wall, the contact surface being provided on a curved portion of the contact member including the junction between the spring portion and end portion, and at least a spring portion formed of a thin electroconductive metal strip having a width to thickness ratio greater than about 3 to 1.

Other objects, features and advantages will be apparent to one skilled in the art from the following description of a preferred embodiment of this invention, taken together with the attached drawings thereof, in which.

Figures 1, 2, 3:
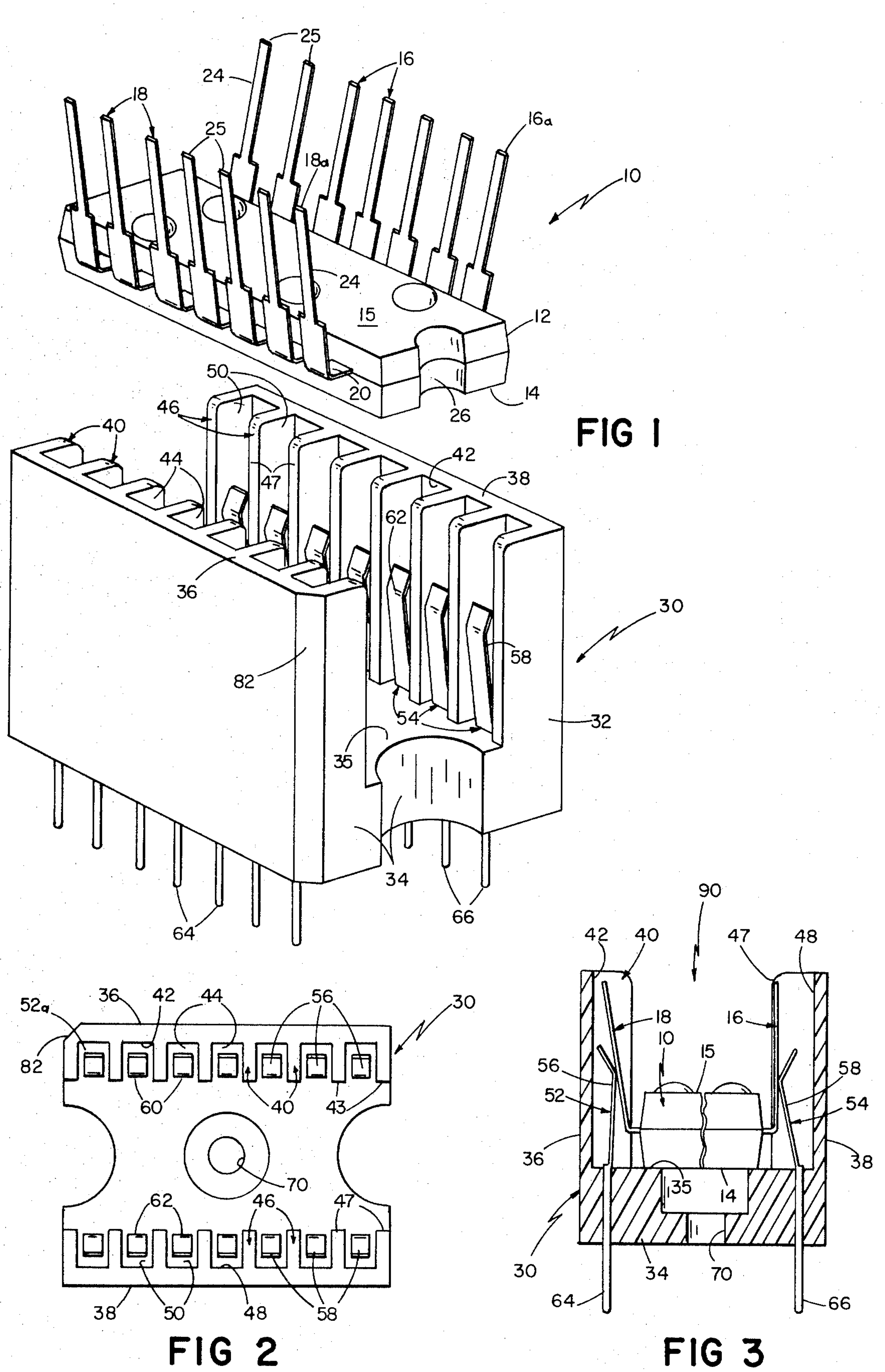
FIG. 1 is an exploded view of an integrated circuit package and a socket embodying the present invention.
FIG. 2 is a top view of the socket of FIG. 1.
FIG. 3 is a sectional view of the socket of FIG. 1, with a composite integrated circuit package, shown in full, in engagement with the socket.

In the figures there is shown an electronic component 10 in the form of a "dual-in-line" circuitry package or "DIP" having a body or block 12 formed of electrical insulating material, including opposed planar surfaces 14, 15 and enclosing circuitry (not shown), and two sets of electrical leads 16, 18, each lead terminating within block 12 at an appropriate location of the integrated circuit within. Each lead 16 is substantially parallel to all other leads 16, and each lead 18 is substantially parallel to all other leads 18. The illustrated DIP has a total of 14 leads, but of course the configuration and number of leads for any DIP depends on the terminals provided by the circuitry enclosed within.

Each lead 16, 18 has an inner portion 20 extending substantially parallel to surface 15 of block 12, and an engagement portion 24, which is disposed either perpendicular to surface 15, or outwardly of block 12 at an angle of up to about 15° to surface 15, all of the portions 24 terminating in ends 25 on one side of a plane through block 12 parallel to surface 15. A notch 26 is cut into one end of block 12, to indicate its polarization, leads 18*a* being therefore the "No. 1" lead and lead 16a the "No. 14" lead.

Socket 30 includes a housing 32 of electrical insulating material (e.g., a silicone), having an end wall 34 defining an interior surface 35 and side walls 36, 38. A first plurality of parallel ribs 40 project from the inside surface 42 of side wall 36 to an inner edge 43, defining therebetween parallel elongated channels 44 of substantially rectangular cross-section, and a second plurality of parallel ribs 46 project from the inside surface 48 of side wall 38 to an inner edge 47, defining therebetween parallel elongated channels 50 also of substantially rectangular cross-section. Each contact member 52, 54 has a leaf spring portion 56, 58, respectively, formed of thin conductive material, about 0.060 inch wide and 0.007 inch thick, each of which has its end bent back at a point about 0.200 inch above surface 35 and at an angle of about 45° to surface 35, toward surface 42 or 48, respectively, the ends terminating short of surfaces 42 and 48. Each spring portion 56, 58 lies completely between its adjacent side wall and a plane defined by the inner edges 43 or 47 of the ribs defining the channel within which the particular spring portion is located. The inside contact face 60, 62 of each spring portion 56, 58, respectively, is preferably gold plated. The rigid terminal shank 64, 66 of each contact member 52, 54 is formed integrally with the corresponding leaf spring portion 56, 58, and projects through bottom wall 36. The ends of shanks 64, 66, may be inserted into appropriate terminals of the test circuitry. The socket may be secured to this test circuitry by various means, including soldering the shank ends in their appropriate terminals in the test circuitry structure, or through methods of wire-wrapping the terminals by inserting a fastener through orifice 70 of socket 30 into the test circuitry structure.

The opposed inner contact surfaces 60, 62 are spaced apart so as to engage, under spring force, the outer surfaces of the opposite leads 16, 18 of a DIP 10, even when those leads are both disposed at 90° to surface 35. Leads 16, 18 must project at least past the plane defined by the lower end of the spring portion 56, 58 and the edge of surface 22 facing the contact member. The number of contact members 52, 54 provided in a particular socket 30 depends on the number of leads of the electrical component the socket is designed to receive.

One corner 82 of housing 32 is notched to identify the No. 1 contact member 52*a*, for orienting DIP 10 prior to insertion.

In operation, to insert a DIP 10 into a socket 30, with the bottom surface 14 of DIP 12 adjacent the open end of socket 30, as shown in FIG. 1, each package lead 16, 18 is aligned, with a channel 44, 50, respectively, with the No. 1 lead 16a aligned with the channel 44 containing the No. 1 contact 52*a*. The DIP is then pushed into the socket, through its open end, against the spring force exerted on the outside of each lead by the corresponding spring portion 56, 58, until the bottom surface 14 of block 12 is on surface 35 of socket 30. Ribs 40, 46 isolate each contact member and its engaged lead from adjacent contacts and leads. As shown in FIG. 3 by means of a composite DIP 90, whether the lead of the DIP is at 90° (right-hand side) or 105° (left-hand side) to surface 15, a firm electrical connection to the contact member is made. Thus, even where a single DIP has leads projecting at different angles, good electrical connection may be made to all leads for testing the DIP.

Preferably, so that the entire spring portion 56, 58 may be maintained within its chamber 44, 50, the leads, if angled in a DIP at 15° as shown in FIG. 1, should terminate not less than about 0.100 inch above surface 35. To avoid contact between the outer edge of the end of the lead and the contact member, the end of the lead should terminate beyond the point of engagement of the contact member.

Since no lead end contacts any contact member during or even after insertion, the gold plating on the contact member remains intact, even though a large number of DIPs have been successively inserted and removed from the socket. Moreover, inasmuch as electrical connection is made along the outside of, rather than to the end of, each DIP lead, the socket is useful with a wide range of lengths of leads. As seen in FIG. 3, for example, about the upper half of each lead 16, 18 is above the point of contact with contact members 52, 54, respectively.

Other embodiments will occur to those skilled in the art and are within the following claims.

What is claimed is:

1. In combination, an electronic component having a body enclosing circuitry and two sets of leads from said circuitry projecting from said body, said sets spaced apart from one another, each set having its leads arranged substantially in parallel, said sets extending along opposite sides of said body and making an angle of about 0° to 30° with one another, all of said leads terminating on one side of a plane through said body, and each said lead having an outer surface facing away from other leads, and a socket comprising a housing of electrical insulating material having an end wall defining a closed end, an opposite open end, opposed substantially parallel side walls, substantially perpendicular to said end wall, and spaced apart to define said open end, and a plurality of spaced-apart parallel ribs projecting inwardly from each side wall and extending along each said side wall between said bottom wall and said open end, to define with the adjacent said side wall a plurality of spaced apart parallel channels, and two sets of electrical contact members defining two sets of contact surfaces extending from said closed end toward said open end, one said set of contact members being arranged adjacent each of said parallel side walls, each set having its contact surfaces arranged in a single plane, and said sets of contact members spaced apart from one another by a distance less than the distance between said sets of leads, each said contact member having a spring portion providing a said contact surface engaging the said outer surface of one of said leads from said electrical component between said circuitry and said terminating end of said lead, one of said contact members being located in each said channel, with its spring portion located entirely within the respective channel, said electronic component being oriented in said socket with said body adjacent the closed end of said socket and said leads extending from said body toward the open end of said socket.

2. The apparatus of claim 1 wherein said electronic component has a body formed of insulating material and of substantially rectangular cross-section encapsulating said circuitry, said plane through said body being parallel to planar surfaces of said body, each said lead includes a first portion projecting outwardly of said body substantially parallel to said planar surfaces, and a second portion disposed at an angle of about 90° to about 105° to said first portion, each said lead constructed to terminate within the channel having the contact member engaged to said lead.

3. The apparatus of claim 2 wherein the said first portion of each said lead extends from said body into said channel, and the said second portion of each said lead is contained entirely within said channel.

4. The apparatus of claim 1 wherein each said contact member includes a rigid shank integrally secured to said spring portion, said shank firmly secured within said end wall and projecting from the opposite side of said end wall, the projecting portion of said rigid shank being constructed for electrical connection to external circuitry.

5. The apparatus of claim 1 wherein each said contact member has an end portion constructed to diverge away from said lead toward said side wall.

6. The apparatus of claim 5 wherein said contact surface is provided on a curved section of said contact member including the junction between said spring portion and said end portion.

* * * * *